United States Patent [19]

Yamada et al.

[11] Patent Number: 4,981,666
[45] Date of Patent: Jan. 1, 1991

[54] METHOD FOR THE PREPARATION OF SILICON CARBIDE WHISKERS

[75] Inventors: Motoyuki Yamada; Minoru Takamizawa; Akira Hayashida; Nobuaki Urasato; Hiromi Ohsaki, all of Niigata, Japan

[73] Assignee: Shin-Etsu Chemical Co., Ltd., Tokyo, Japan

[21] Appl. No.: 931,667

[22] Filed: Nov. 17, 1986

[30] Foreign Application Priority Data

Nov. 27, 1985 [JP] Japan ................. 60-266687

[51] Int. Cl.$^5$ ............................................. C01B 31/36
[52] U.S. Cl. .................................... 423/345; 423/346; 423/439; 156/DIG. 112; 561/88; 528/25; 528/33; 556/430
[58] Field of Search ............... 423/345, 346, 439; 156/DIG. 112; 501/88; 528/25, 33; 556/430

[56] References Cited

U.S. PATENT DOCUMENTS

| | | | |
|---|---|---|---|
| 2,696,480 | 12/1954 | Gordon et al. | 528/35 |
| 4,117,057 | 9/1978 | Yajima et al. | 423/345 |
| 4,184,852 | 1/1980 | Russ | 423/439 |
| 4,310,481 | 1/1982 | Baney | 423/345 |
| 4,310,651 | 1/1982 | Baney et al. | 528/33 |

FOREIGN PATENT DOCUMENTS 60-200814 10/1985 Japan ................. 423/439

OTHER PUBLICATIONS

J. V. Milewski et al., Journal of Materials Science, vol. 20, pp. 1160–1166, (1985).
J. V. Milewski et al., Los Alamos, Nat. Laboratory, LA-9650-MS, (Feb. 1983).

*Primary Examiner*—O. Chaudhuri
*Assistant Examiner*—Robert M. Kunemund
*Attorney, Agent, or Firm*—McAulay Fisher Nissen & Goldberg

[57] ABSTRACT

In place of the conventional silicon source materials used in the prior art method for the preparation of silicon carbide whiskers, the inventive method utilizes a hydrolysis product of a chlorosilane compound $R_aSiCl_{4-a}$ or a chlorodisilane compound $R_bSi_2Cl_{6-b}$, in which R is a hydrogen atom or a monovalent hydrocarbon group, a is zero to 3 and b is 1 to 5, as the silicon source which is intimately mixed with a powder of carbon and the mixture is heated at 1400° to 1700° C. to give silicon carbide whiskers in a high conversion. Alternatively, the hydrolysis of the chloro(di)silane compound is performed in an aqueous medium in which a powder of carbon is dispersed in advance so that the hydrolysis product as formed is already a mixture with the carbon powder.

6 Claims, 1 Drawing Sheet

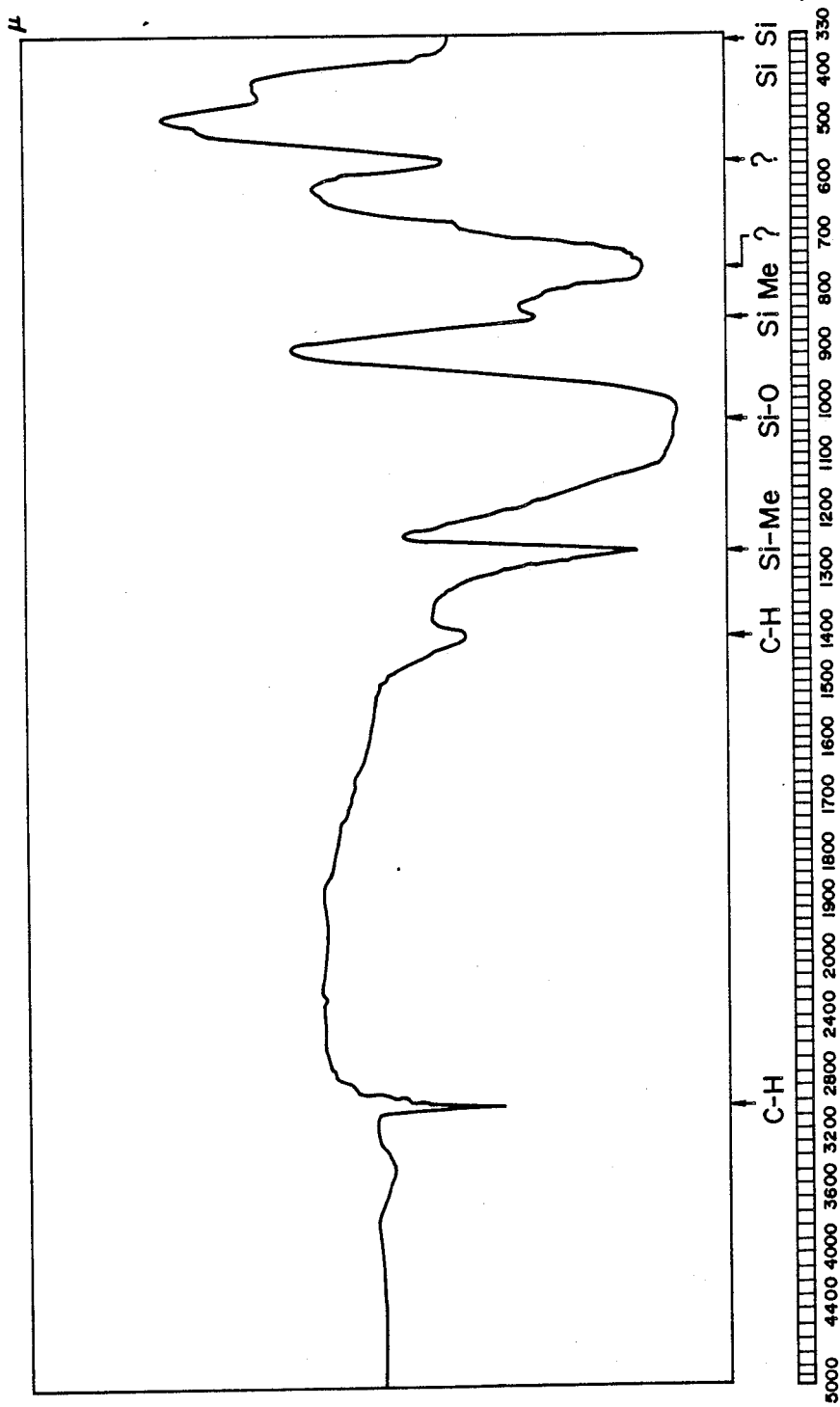

METHOD FOR THE PREPARATION OF SILICON CARBIDE WHISKERS

BACKGROUND OF THE INVENTION

The present invention relates to a method for the preparation of silicon carbide whiskers or, more particularly, to an inexpensive and easy method for the preparation of silicon carbide whiskers from industrially useless silicon compounds available as the by-products of various processes as the starting material in a high yield.

As is known, silicon carbide whiskers have outstandingly high mechanical strength, elastic modulus, oxidation resistance, heat resistance and chemical stability in comparison with other fibrous materials used hitherto for the reinforcement of composite materials and also have good wettability on various kinds of metals. Therefore, silicon carbide whiskers are recently highlighted as the reinforcing fibers in composite materials with various kinds of ceramics, metals, plastics and others as the matrix.

Several methods are known for the preparation of silicon carbide whiskers including (1) a method of solid-phase reduction of silicon dioxide with carbon, (2) a method of high-temperature gas-phase reaction of an organosilicon compound or a mixture of a silicon compound and a carbon compound and (3) a method of vapor-phase whisker growing by the reaction of a fluorine-containing silicate and carbon. These methods have their respective problems and disadvantages. Although the second and the third methods mentioned above can be relatively easily performed for the production of a small quantity of the whiskers in a laboratory-scale, for example, great difficulties are unavoidable when a process for the mass production of the whiskers should be established in large facilities of industrial scale because the reaction must be performed at an extremely high temperature in addition to the inflammability of the reactant gases and corrosiveness of the by-product gases. In contrast thereto, the first method is advantageous because no inflammable gases are used in the process to facilitate construction of large facilities for mass production and a three-dimensionally isotropic whisker preform can be easily manufactured since the whiskers produced by the method are in a powdery form. Accordingly, several modifications of this method of solid-phase reduction have been developed including (a) a method in which silicon carbide whiskers are deposited in the course of the production of silicon carbide blocks by the Acheson's method, (b) a method utilizing the siliceous constituents contained in seed hulls of gramineous plants as the starting material, (c) a method using silica sand as the starting material, (d) a method using glass wastes as the starting material and (e) a method in which the starting material is a synthetically prepared silica material having a large specific surface area such as silica sols, silica gels and the like.

These prior art methods are also not free from several problems and disadvantages of their own. For example, the method (a) is inherently not suitable for industrialization because deposition of the silicon carbide whiskers depends merely on eventuality. The method (b) involves disadvantages that the seed hulls as the starting material must be subjected to a pretreatment of carbonization or ashing prior to the reaction while a large equipment is required for the pretreatment because the content of silica in the seed hulls rarely exceeds 20% by weight. The method (c) also requires a pretreatment of the silica sand into a finely pulverized powder while even an extremely finely pulverized powder of silica sand, which is a crystalline material, has low reactivity due to the crystallinity thereof in comparison with amorphous siliceous materials so that the productivity of the silicon carbide whiskers cannot be high enough. The method (d) is practically not feasible because the starting material usually contains a large amount of metallic impurities other than silicon which are more or less unavoidably taken into the silicon carbide whiskers as the product to cause degradation of the product quality. Moreover, some of the metallic impurities are volatile at high temperatures so that, when the starting material is heated, such impurities are dissipated in the form of vapor which is condensed and deposited on the surface of a cold part of the apparatus to inhibit continuous running of the process. The method (e) is economically not advantageous due to the expensiveness of the starting siliceous material as a silicon source. Moreover, the initially large specific surface area of the starting material is gradually decreased as the temperature of the material is increased to cause shrinkage and the silica material loses the reactivity of the surface along with decrease in the specific surface area. Thus, none of the above described prior art methods is quite satisfactory from the standpoint of industrial production of silicon carbide whiskers.

SUMMARY OF THE INVENTION

Accordingly, the present invention has an object to provide a novel improved method for the preparation of silicon carbide whiskers free from the above described problems and disadvantages in the prior art methods. Thus, the method of the present invention for the preparation of silicon carbide whiskers comprises the steps of:

(a) hydrolyzing a chlorosilane compound represented by the general formula

$$R_a SiCl_{4-a}, \qquad (I)$$

in which R is a hydrogen atom or a monovalent hydrocarbon group and a is zero, 1, 2 or 3, or a chlorodisilane compound represented by the general formula

$$R_b Si_2 Cl_{6-b} \qquad (II)$$

in which R has the same meaning as defined above and b is a positive integer of 1 to 5 inclusive, to form a hydrolysis product;

(b) mixing the hydrolysis product with carbon to give a mixture; and (c) heating the mixture at a high temperature to effect reaction of the hydrolysis product and carbon.

Alternatively, the mixture of a hydrolysis product of the chlorosilane or chlorodisilane compound and carbon can be obtained by performing the hydrolysis reaction in the presence of a powdery carbonaceous material dispersed in the hydrolysis medium.

BRIEF DESCRIPTION OF THE DRAWING

The FIGURE shows an infrared absorption spectrum of a hydrolysis product of dimethyl tetrachlorodisilane.

DETAILED DESCRIPTION OF THE PREFERRED EMBODIMENTS

As is understood from the above given summary of the invention, the starting silicon source in the inventive method is a chlorosilane compound of the general formula (I) or a chlorodisilane compound of the general formuls (II). These chloro(di)silane compounds can be synthesized in large quantities in a relatively simple process or obtained as the by-products of low value in the industry of silicones so that they are inexpensive and available in any large quantities. The hydrolysis product thereof contains linkages insusceptible to hydrolysis such as —Si—H, —Si—C— and —Si—Si— while these linkages are decomposed in the course of the temperature elevation up to the temperature necessary for the formation of silicon carbide to give an intermediate having very high reactivity which readily reacts with the carbon to be converted into desired silicon carbide whiskers in a high conversion of silicon into silicon carbide.

The starting material as the silicon source in the inventive method is a chlorosilane compound of the general formula (I) or a chlorodisilane compound of the general formula (II) given above. In these formulas, the symbol R denotes a hydrogen atom or a monovalent hydrocarbon group exemplified by alkyl groups, e.g. methyl, ethyl, propyl and butyl groups, alkenyl groups, e.g. vinyl and allyl groups, aryl groups, e.g. phenyl and tolyl groups, cycloalkyl groups, e.g. cyclohexyl group, and the like, of which methyl is preferred. The subscript a is zero or a positive integer of 1 to 3 and b is a positive integer of 1 to 5. These chlorosilane and chlorodisilane compounds may be used either singly or as a combination of two kinds or more according to need.

Examples of the chlorosilane compounds include methyl trichlorosilane, dimethyl dichlorosilane, trimethyl chlorosilane, vinyl trichlorosilane, phenyl trichlorosilane, trichlorosilane, dichlorosilane, silicon tetrachloride and the like. These chlorosilane compounds are produced by the direct reaction of metallic silicon with an organic chlorine compound such as methyl chloride for the synthesis of, for example, methyl chlorosilanes such as dimethyl dichlorosilane, methyl trichlorosilane and the like or obtained as the by-products in such a reaction. In addition, some of them are produced by the direct reaction of metallic silicon with hydrogen chloride, by which trichlorosilane as the important starting material of semiconductor silicon as well as several by-product silanes such as dichlorosilane, silicon tetrachloride and the like are produced. As a possibility, some of them can be produced by the disproportionation reaction of trichlorosilane or by the reducing hydrogenation reaction of silicon tetrachloride with lithium aluminum hydride as the hydrogenating agent.

Examples of the chlorodisilane compounds include methyl pentachlorodisilane, dimethyl tetrachlorodisilane, trimethyl trichlorodisilane, triphenyl trichlorodisilane, tetravinyl dichlorodisilane and the like. These chlorodisilane compounds are usually contained in large amounts in the high-boiling fraction formed as a by-product in the above mentioned direct synthesis of chlorosilane compounds and they are industrially useless and hitherto discarded so that they are available easily and with outstanding inexpensiveness. These chlorodisilane compounds also can be obtained by the pyrolysis and chlorination of polymethylsilanes.

When the starting silicon source in the inventive method is a mixture of two kinds or more of the chlorosilane compounds, of which the subscript a in the general formula (I) is zero or a positive integer of 1 to 3, and the chlorodisilane compounds, of which the subscript b in the general formula (II) is a positive integer of 1 to 5, in a suitable proportion, the atomic ratio of silicon to carbon in the starting material can be controlled at any desired value by an appropriate combination of them in a suitable proportion. It is preferable that these chlorosilane and chlorodisilane compounds should be purified by distillation prior to use as the starting material in the inventive method in order to remove any trace amount of metallic impurities including copper as the most probable metallic impurity since the above mentioned direct synthesis of the chlorosilane compounds is performed by use of metallic copper as the catalyst and such metallic impurities including copper and other metals may be eventually contained in the product of silicon carbide whiskers to affect the quality thereof.

The first step of the inventive method is the hydrolysis of one or a mixture of these chlorosilane and chlorodisilane compounds. The reaction of hydrolysis is performed by bringing the chlorosilane or chlorodisilane compound in the form of vapor or liquid into contact with water so that the —Si—Cl linkages therein are hydrolyzed and converted into —Si—O—Si— linkages with evolution of hydrogen chloride gas to give a hydrolysis product of which the main skeletal structure is composed of the atoms of silicon and oxygen. Care should be taken in performing the hydrolysis reaction to avoid bumping of water and splashing of the hydrochloric acid sometimes caused when a large amount of the silane compound is rapidly introduced into water due to the large heat of dissolution of hydrogen chloride gas in water. The hydrolysis product obtained in this manner is then subjected to the adjustment of the pH value according to need and drying before it is transferred to the next step of the inventive method.

The starting material of the hydrolysis reaction, i.e. the chlorosilane compound, chlorodisilane compound or a mixture thereof, should be formulated in such a manner that the molar ratio of the hydrogen atoms or monovalent hydrocarbon groups R to the silicon atoms, i.e. R:Si, is in the range from 0.3 to 2.0 or, preferably, from 0.5 to 1.75. When the molar ratio of R:Si is smaller than 0.3, the hydrolysis product would have low reactivity while, when the molar ratio of R:Si is larger than 2.0, on the other hand, low-boiling organopolysiloxane compounds may be formed from the hydrolysis product when a mixture thereof with carbon is heated in the next step to cause a considerable loss of the silicon constituent in the starting material decreasing the yield of the silicon carbide whiskers as the desired product. Namely, the starting material of the hydrolysis reaction should be prepared by suitably combining two kinds or more of the chlorosilane and chlorodisilane compounds so that the molar ratio of R:Si in the hydrolysis product can be within the above mentioned range or preferable range.

The hydrolysis product is obtained in an inherently very fine powdery form and the primary particles thereof usually have a diameter of 1 $\mu$m or smaller as is shown by the microscopic examination. Although the hydrolysis product is sometimes obtained in a conglomerated form, the conglomerate is very fragile and can be readily disintegrated into primary particles even under a very small external force. Therefore, disintegration of conglomerated hydrolysis product can be performed by use of a pulverizing machine of relatively low efficiency such as ball mills and tube mills without using a crushing machine such as jaw crushers and hammer mills or more powerful but somewhat less efficient pulverizing machine such as vibration mills and jet mills.

The thus obtained hydrolysis product in a finely pulverized form is then intimately blended with powdery carbon. Suitable carbon source materials include carbon blacks such as acetylene black, furnace black and the like and finely pulverized carbonaceous materials such as activated carbon and the like. The amount of the carbon blended with the hydrolysis product should be at least three times by mole of the silicon atoms in the hydrolysis product since the reaction therebetween to form silicon carbide proceeds according to the reaction equation of $$SiO_2 + 3C \rightarrow SiC + 2CO.$$

Since the reaction of the hydrolysis product with the carbon is a solid-phase reaction, it is essential that they are mixed together as intimately and uniformly as possible. It is sometimes advantageous in this regard that, although initmate and uniform blending of them can be achieved by prolongedly performing dry blending of the two materials each in a powdery form, the hydrolysis reaction of the chlorosilane and/or chlorodisilane compounds is performed using an aqueous dispersion of the carbon material in a fine powdery form so that mixing of the hydrolysis product and the carbon powder takes place as the hydrolysis product is formed in the aqueous medium by the hydrolysis of the silane compounds and the lengthy process of dry blending of the powdery materials can be omitted. It is of course essential in this case that the dispersion of the carbon powder in the aqueous medium should be as uniform as possible and formation of the hydrolysis product should also be as uniform as possible throughout the aqueous medium since no uniform and intimate mixture of the carbon powder and the hydrolysis product can be obtained when the dispersion of the carbon powder in the aqueous medium is not uniform or the formation of the hydrolysis product is localized in the aqueous medium. Uniformity of the carbon powder dispersion and formation of the hydrolysis product can be ensured by vigorously agitating the aqueous medium throughout the hydrolysis reaction. An advantageous result can be sometimes obtained by subjecting the mixture to an ultrasonic treatment or by adding a surface active agent to the aqueous medium.

The thus obtained uniform and intimate mixture of the hydrolysis product and carbon powder is then heated to effect the reaction between them for the formation of silicon carbide whiskers. This reaction should be performed preferably in an atomosphere of a non-oxidizing gas or an inert gas. The temperature of heating should be in the range from 1400° to 1700° C. or, preferably, from 1500° to 1600° C. When the temperature is lower than 1400° C., substantially no reaction of silicon carbide formation takes place so that the desired silicon carbide whiskers cannot be obtained. When the temperature is higher than 1700° C., on the other hand, the silicon carbide whiskers produced thereby would have an unduly large diameter and low aspect ratio. The heating treatment should be performed for at least 0.5 hour or, preferably, at least 1 hour.

As is mentioned before, the hydrolysis product contains linkages of —Si—H, —Si—C—, —Si—Si— and the like as is typically shown by the infrared absorption spectrum of the hydrolysis product of 1,2-dimethyl-1,1,2,2-tetrachlorodisilane illustrated in the figure of the accompanying drawing. While stable at room temperature, these linkages are decomposed at the above mentioned reaction temperature to form hydrogen, methane and the like as the decomposition gas which is dissipated to leave highly active silicon atoms. Such highly activated silicon atoms can easily and effectively react with the carbon so that silicon carbide whiskers can be produced in a greatly increased yield in comparison with the conventional methods.

The silicon carbide whiskers obtained in the above described manner usually contain an excess amount of carbon. This crude product of silicon carbide whiskers can be upgraded to have a purity of 99.0 to 99.5% by heating at a temperature of 600° to 800° C. in an oxidizing atmosphere or under air stream so as to oxidize the excess amount of carbon into a gaseous form. Further, it is sometimes advantageous that this product is treated with hydrofluoric acid to remove the hydrolysis product of the chloro(di)silane compounds remaining unreacted. The yield of the silicon carbide whiskers as the product can be as high as 70 to 90% after these upgrading treatments. The product of silicon carbide whiskers obtained by the above described inventive method is an agglomerate of short staple-like fibers having a diameter of 0.1 to 0.5 μm and an aspect ratio in the range from 10 to 200 although it has a powder-like appearance as viewed and can be handled as a powder. Therefore, the inventive silicon carbide whiskers can be shaped by a conventional molding technique such as extrusion molding and compression molding into a desired form. Furthermore, the silicon carbide whiskers can be easily and uniformly blended with other powdery materials as a base constituent of composite materials so that they are very useful as the staple fibers for the reinforcement of ceramics, metals, plastics and the like to form composite materials.

In the following, the method of the present invention is described in more detail by way of examples.

EXAMPLE 1

A 1:1 by moles mixture of trimethyl trichlorodisilane and dimethyl tetrachlorodisilane in an amount of 54.4 g was gradually introduced into a large volume of water to form a gel-like white precipitates which were collected by filtration and washed with water repeatedly followed by drying to give 30.3 g of a granular hydrolysis product. The carbon to silicon molar ratio C:Si therein was 1.22 according to the result obtained with a carbon analyzer.

This granular hydrolysis product was then pulverized for 3 hours in a ball mill into a fine powdery form which was blended with 36.0 g of a carbon black having a bulk density of 0.2 g/cm$^3$ in a V-mixer. The powdery blend was put into a carbon-made crucible and heated for 2 hours at 1500° C. in an atmosphere of argon gas and then heated at 750° C. for 1 hour under air stream to oxidize free carbon left after the reaction to form silicon carbide whiskers. This product was further immersed for 1 hour in a 50% hydrofluoric acid to dissolve away and remove the unreacted hydrolysis product of the disilane compounds followed by drying. In this manner, 16.6 g of silicon carbide whiskers were obtained. The conversion into silicon carbide or yield relative to silicon was 83%. The silicon carbide whiskers as the product had an aspect ratio in the range from 10 to 200 according to the result of an electron microscopic examination.

EXAMPLE 2

The experimental procedure was substantially the same as in Example 1 except that the blending work of the hydrolysis product and carbon black was performed by blending 30.3 g of the hydrolysis product in the granular form and 36.0 g of the carbon black and subjecting the blend to pulverization for 3 hours in a ball mill so as to simultaneously effect disintegration of the granular hydrolysis product into a fine powdery form and mixing thereof with the carbon black. In this manner, 15.8 g of silicon carbide whiskers were obtained with 79% of the conversion into silicon carbide relative to silicon.

EXAMPLE 3

Into 3000 ml of an aqueous dispersion medium containing 10% by weight of methyl alcohol as a dispersion aid were added 36.0 g of the same carbon black as used in Example 1 and the mixture was first agitated for 5 minutes with a screw mixer, then subjected to disintegration of the agglomerates of carbon black particles using an ultrasonic vibration disintegrator and finally agitated again for 5 minutes with the screw mixer to give an aqueous medium for the hydrolysis reaction containing carbon black dispersed therein. Thereafter, 54.4 g of the same methyl chlorodisilane mixture as used in Example 1 were slowly introduced into the aqueous medium under agitation to give a uniform mixture of the hydrolysis product of the disilane compounds and the carbon black. This mixture was collected by filtration, washed with water, completely dried and pulverized for 3 hours in a ball mill to give 65.3 g of a powder as a mixture of the hydrolysis product and the carbon black.

The powdery mixture obtained in this manner was put into a carbon-made crucible and heated to effect the reaction between the hydrolysis product and the carbon black followed by the post-treatment in the same manner and under the same conditions as in Example 1 to give 16.6 g of silicon carbide whiskers in 83% of the conversion into silicon carbide.

EXAMPLE 4

A powdery hydrolysis product was prepared by hydrolyzing a chlorosilane compound, chlorodisilane compound or mixture of two kinds of chlorosilane compounds as indicated in Table 1 below in the same manner as in Example 1 followed by washing with water, drying and pulverization. The hydrolysis product was analyzed for the contents of carbon and hydrogen to give the molar ratio of R:Si as is shown in Table 1.

The hydrolysis product was taken in an amount shown in Table 1 in g and blended with 36.0 g of the same carbon black as used in Example 1 and thoroughly mixed together in a V-mixer. The powdery mixture was put into a carbon-made crucible and heated at 1500° C. for 2 hours in an atmosphere of argon to effect the reaction between the hydrolysis product and the carbon black followed by the post-treatment in the same manner as in Example 1 to give a product of silicon carbide whiskers in a yield in g and in a % conversion to silicon carbide as shown in the table.

TABLE 1

| Experiment No. | Chloro(di)silane compounds (mixing ratio by moles) (taken, g) | Hydrolysis product R:Si | Hydrolysis product Taken, g | Silicon carbide whiskers Yield, g | Silicon carbide whiskers Conversion, % |
|---|---|---|---|---|---|
| 1 | Trichlorosilane + dichlorosilane (20:1) (66.9) | 1.00 | 26.3 | 16.8 | 84 |
| 2 | Trichlorosilane + silicon tetrachloride (1:1) (76.4) | 0.47 | 28.3 | 14.2 | 71 |
| 3 | Methyl trichlorosilane (—) (74.8) | 0.96 | 33.5 | 15.6 | 78 |
| 4 | Trichlorosilane + methyl trichlorosilane (1:1) (71.3) | 0.95 | 30.0 | 15.8 | 79 |
| 5 | Methyl trichlorosilane + trimethyl chlorosilane (5:1) (71.3) | 1.31 | 34.6 | 15.4 | 77 |
| 6 | Trichlorosilane + silicon tetrachloride (1:2) (79.3) | 0.31 | 28.8 | 14.0 | 70 |
| 7 | Tetramethyl dichlorodisilane (—) (46.8) | 1.95 | 33.0 | 14.2 | 71 |

EXAMPLE 5

The experimental procedure was substantially the same as in Example 1 except that the heating temperature of the powdery mixture of the hydrolysis product and the carbon black was varied in the range from 1400° to 1700° C. instead of 1500° C. Table 2 below shows the % conversion into silicon carbide whiskers as the product for each of the heating temperatures.

TABLE 2

| Experiment No. | Heating temperature, °C. | Conversion, % |
|---|---|---|
| 1 | 1400 | 35 |
| 2 | 1450 | 67 |
| 3 | 1600 | 85 |
| 4 | 1700 | 69 |

COMPARATIVE EXAMPLE 1

A uniform powdery mixture was prepared by blending 30.0 g of pulverized silica stone having an average particle diameter of 1 μm and 36.0 g of the same carbon black as used in Example 1 and the powdery mixture was heated and subjected to a post-treatment in the same manner as in Example 1 to give silicon carbide whiskers as the product. The conversion into silicon carbide was only 45%.

COMPARATIVE EXAMPLE 2

The experimental procedure was substantially the same as in Comparative Example 1 except that 30.0 g of the pulverized silica stone were replaced with the same amount of pulverized and dried silica gel having an average particle diameter of 3 μm. The result was that the conversion into silicon carbide was 51%.

What is claimed is:

1. A method for the preparation of silicon carbide whiskers which comprises the steps of:
   (a) hydrolyzing a chlorosilane compound represented by the general formula $R_aSiCl_{4-a}$, a chlorodisilane compound represented by the general formula $R_bSi_2Cl_{6-b}$, or a mixture thereof, in which R is a hydrogen atom or a monovalent hydrocarbon group, the subscript a is zero, 1, 2, or 3 and the subscript b is a positive integer of 1 to 5 inclusive, in an aqueous medium to form a hydrolysis product;
   (b) mixing the hydrolysis product with carbon to give a powdery mixture; and
   (c) heating the powdery mixture at a temperature in the range from 1400° to 1700° C. to effect reaction of the hydrolysis product and carbon.

2. The method for the preparation of silicon carbide whiskers as claimed in claim 1 wherein the molar ratio of the groups denoted by R to the silicon atoms Si in the chlorosilane compound, chlorodisilane compound or a mixture thereof is in the range from 0.3 to 2.0.

3. The method for the preparation of silicon carbide whiskers as claimed in claim 1 wherein the amount of carbon mixed with the hydrolysis product is at least 3 moles per mole of the silicon atoms in the hydrolysis product.

4. A method for the preparation of silicon carbide whiskers which comprises the steps of:
   (a) hydrolyzing a chlorosilane compound represented by the general formula $R_aSiCl_{4-a}$, a chlorodisilane compound represented by the general formula $R_bSi_2Cl_{6-b}$, or a mixture thereof, in which R is a hydrogen atom or a monovalent hydrocarbon group, the subscript a is zero, 1, 2, or 3 and the subscript b is a positive integer of 1 to 5 inclusive, in an aqueous medium containing powdery carbon dispersed therein to form a mixture of the hydrolysis product of the chlorosilane or chlorodisilane compound with the powdery carbon; and
   (b) heating the mixture of the hydrolysis product and the powdery carbon at a temperature in the range from 1400° to 1700° C. to effect reaction of the hydrolysis product and carbon.

5. The method for the preparation of silicon carbide whiskers as claimed in claim 4 wherein the molar ratio of the groups denoted by R to the silicon atoms Si in the chlorosilane compound, chlorodisilane compound or a mixture thereof is in the range from 0.3 to 2.0.

6. The method for the preparation of silicon carbide whiskers as claimed in claim 4 wherein the amount of the powdery carbon dispersed in the aqueous medium is at least 3 moles per mole of the silicon atoms in the chlorosilane compound, chlorodisilane compound or a mixture thereof hydrolyzed in the aqueous medium.

* * * * *